United States Patent [19]

Gomez

[11] 4,257,822
[45] Mar. 24, 1981

[54] CONTINUOUS THERMOPILE

[76] Inventor: Ernesto E. Gomez, Avianca Bldg., 3rd Floor 1612 Ponce de Leon Ave., Santurce, P.R. 00909

[21] Appl. No.: 201

[22] Filed: Jan. 2, 1979

[51] Int. Cl.³ .................... H01L 35/00; H01L 35/28
[52] U.S. Cl. ................................ 136/206; 136/211; 136/225; 136/227
[58] Field of Search .............. 136/206, 211, 225, 227

[56] References Cited

U.S. PATENT DOCUMENTS

| 3,549,960 | 12/1970 | Wedlock | 136/206 X |
| 3,671,327 | 6/1972 | Gay | 136/225 |
| 3,973,996 | 8/1976 | Kennedy | 136/206 |

FOREIGN PATENT DOCUMENTS

| 1222504 | 2/1971 | United Kingdom | 136/225 |
| 1357217 | 6/1974 | United Kingdom | 136/225 |

Primary Examiner—Leland A. Sebastian
Attorney, Agent, or Firm—Peter L. Berger

[57] ABSTRACT

A current generator is disclosed located in a temperature gradient between a heat source region and a heat sink region. The generator comprises a first continuous material having thermoelectric characteristics and having a repetitive shape with one portion extending between the source and sink and the other portion between the sink and source, and a second material having thermoelectric characteristics electrically connected with only one of said first or second portions of the first material. A thermopile is thus formed and plating techniques can be employed to connect the second material to the first material in the repetitive first or second portions of the first material. In this way, the thermopile is formed of a repetitive series of thermocouples.

20 Claims, 6 Drawing Figures

CONTINUOUS THERMOPILE

BACKGROUND OF THE INVENTION

This invention relates to a current generator, and more particularly, to an improved current generator adapted to work between regions of heat and cold.

Thermocouples are conventionally formed of different thermoelectric materials joined at spaced-apart junctions, with the junctions being located in regions of heat and cold. Due to differences in the internal electron structure between the two materials, a voltage different exists at each junction, which is temperature dependent (Seebeck effect). Due to the temperature dependence of this voltage, there is a net voltage between hot and cold junctions. If the materials are conductors or semiconductors, a current will flow through the thermocouple and a connection is made across terminals connected to the materials. A thermopile is a number of thermocouples connected in series.

Thermopiles are limited in value when serving as current generators, due to the cost, size, complexity and other factors attendant their construction and maintenance.

In order to utilize thermocouples and thermopiles for the generation of electricity from sources of heat, such as the sun, it is necessary to form large thermopiles in order to efficiently collect enough heat and generate enough electricity. Such arrangements are difficult to obtain, expensive to manufacture and generally unwieldly.

An object of this invention is to provide a newly improved current generator, which is easy to manufacture, inexpensive, and susceptible of being used in regions of heat and cold.

Another object of this invention is to provide such a thermocouple which may easily be part of a larger thermopile and may be formed in an efficient and simple manner.

Still another object of this invention is to provide such a current generator, which is capable of generating usable voltages under heat generated by the sun.

Other objects, advantages and features will become more apparent hereinafter and will become more evident as this invention achieves wider use.

SUMMARY OF THE INVENTION

In accordance with the principles of this invention, the above objects are accomplished by providing a current generator to be located in a temperature gradient between a heat source region and a heat sink region, with the generator comprising a first continuous material having thermoelectric characteristics and having a first portion extending between the source and sink and a second portion extending between the sink and source, and a second material having thermoelectric characteristics electrically connected with only one of said first or second portions of the first material. By providing a continuous material, the ability to form a thermopile is efficiently achieved, since the second material may be joined or plated onto the first material on alternate repeat segments thereof. It is required that the second material be electrically connected to the first material, and this may be achieved by plating processes or any other process for efficiently and quickly adhering the second material to a portion of the first material.

The ease of forming such a current generator will become readily apparent, as will a number of important advantages thereof.

It should be noted that the Seebeck effect has been described above, but the operation of the present invention is not explainable only in accordance with this effect. It is possible that the Thomson effect also is in operation, but, to the present, the applicant is unaware of any standard physical theory which can explain the functioning of this new thermocouple structure.

DETAILED DESCRIPTION

Figure 1:
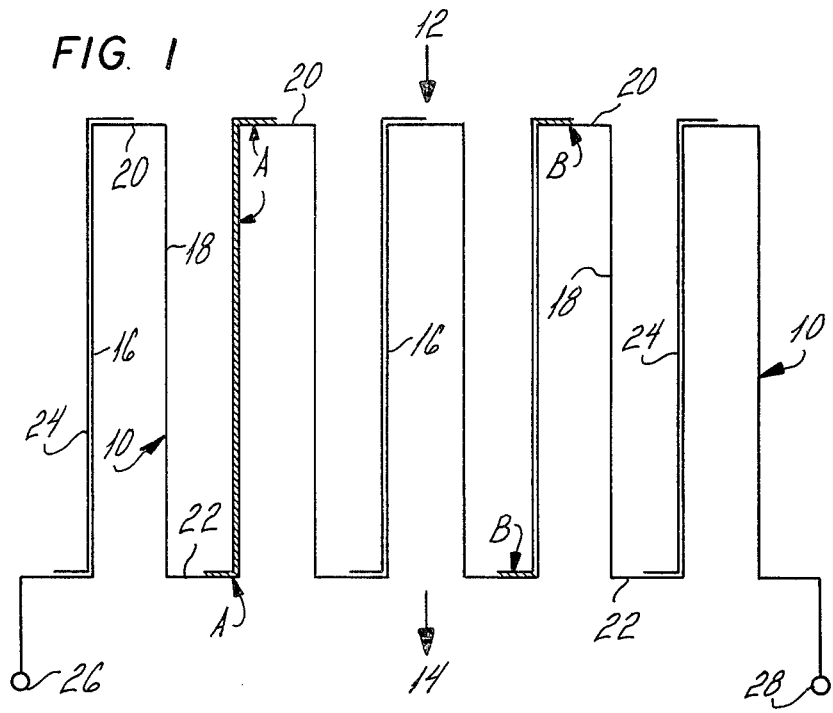
FIG. 1 is a side view of one embodiment of this invention.

FIG. 1 illustrates one embodiment of the present current generator invention in which a first continuous material 10 is formed of a thermoelectric material constructed to extend between a region of heat 12 and a region of cold 14. The material 10 is formed into a repetitive series of similar patterns, with a first intermediate portion 16 extending from the region of sink to source and the second intermediate portion 18 extending between source and sink. The first material has top portion 20 formed as well as base portion 22, with the top and base portions lying within the regions of relative heat and cold.

A second material 24 having thermoelectric characteristics is electrically connected to intermediate portion 16 and extends between the sink and source 14 and 12, respectively. Preferably, the second material is arranged to have continuous electrical contact where material 24 overlaps material 10, as seen in FIG. 1 as A. By repeating the first segment illustrated in FIG. 1, a series of current generators may be formed to provide a thermopile.

In the alternative, the second material is attached to the continuous first material in a non-continuous manner by connecting the second material to the first material at top portion 20 and base portion 22. This is shown in FIG. 1 as B.

As described above, there is no present physical theory to explain the operation of this current generator, but the applicant believes that there is a combination of Seebeck and Thomson effects operating. The materials may be conductors, semiconductors, but primarily must be materials having thermoelectric gradient characteristics so that a voltage is generated between regions of heat and cold when the material is placed between said regions.

When used as a current generator for solar energy applications, heat region 12 may be the source of sun, while region 14 will form a sink. Maintaining the temperature gradient between regions 12 and 14 will enhance the generation of voltage, and therefore current, through the thermopile. The current generated will flow up one leg and down the other of each repetitive segment so as to be collected between junctions 26 and 28.

Figure 2:
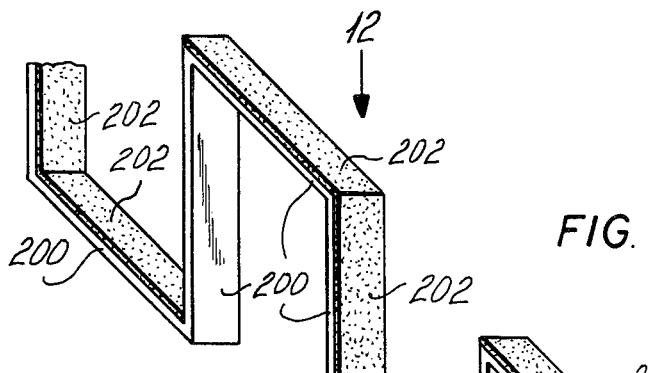
FIG. 2 is a perspective view of another embodiment of this invention.

FIG. 2 is a perspective view of another embodiment of this invention in which a first material having thermoelectric characteristics is designated as 200, while a second material plated to the first material is designated 202 and extends between a heat source area 12 and a heat sink area 14. In the embodiment illustrated in FIG. 2, material 202 may be plated onto material 200 which enables the thermopile to be formed while reducing the number of joining operations encountered in the prior art.

As an example, a standard thermopile with 10 thermocouples requires 20 separate elements, 10 of material 200 and 10 of material 202. Nineteen joining operations are required to construct said thermopile. In accordance with the invention, the present thermopile requires only a single piece of continuous material 200, to which 10 pieces of material 202 are joined by simple joining operations.

By employing a continuous strip for one of the two materials, a rigid base for the assembly of the thermopile may be achieved, and enables such techniques as electroplating to be employed to connect the second material to the first.

Figure 3:
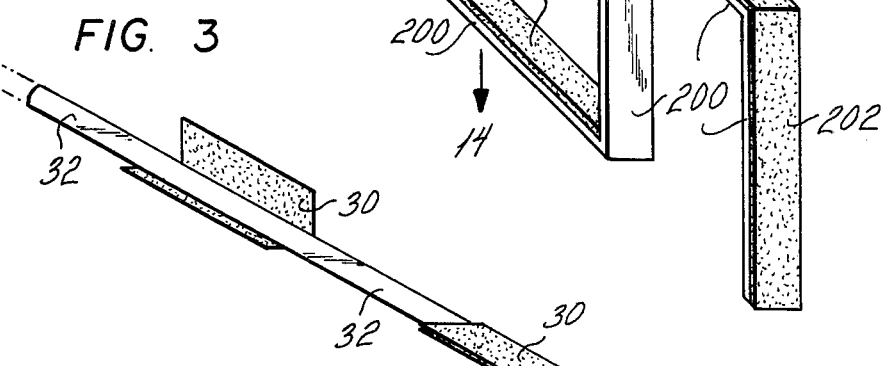
FIG. 3 is an assembly view illustrating one method of forming the current generator of this invention.
Figure 4:
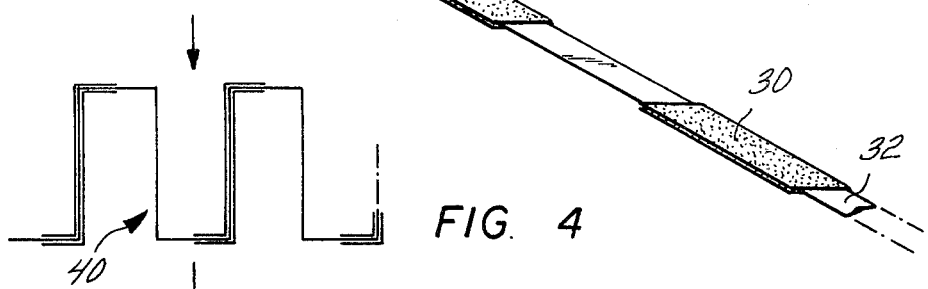
FIGS. 4 and 5 are embodiments of this invention formed in accordance with the method illustrated in FIG. 3.
Figure 5:
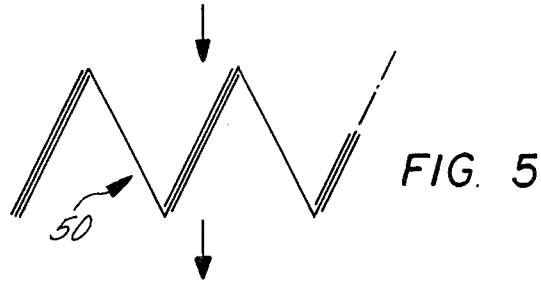

FIG. 3 illustrates yet another technique for joining the discrete material 30 to the continuous material 32, by merely folding material 30 about material 32 to achieve the desired electrical connection between these two materials. FIGS. 4 and 5 illustrate two other embodiments of the current generator in accordance with this invention, with the current generator 40 of FIG. 4 being folded into the step-wave shape after a joining operation, such as the operation illustrated in FIG. 3. FIG. 5 illustrates a current generator folded into a triangular form, with the second material joined to the first continuous material along only one leg of each triangular repeat segment 50. The embodiment illustrated in FIG. 5 is formed after the second material is connected to the first material.

Figure 6:
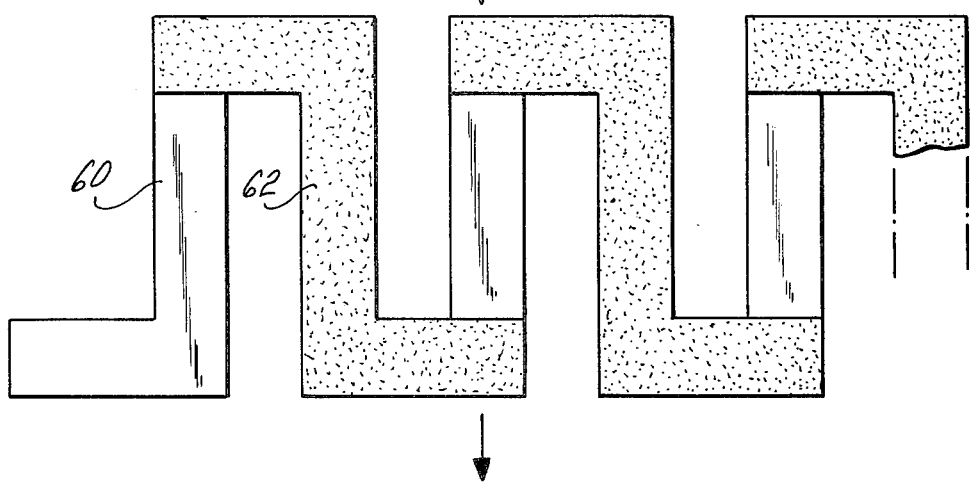
FIG. 6 is another embodiment of the instant invention.

FIG. 6 is a side view of yet another embodiment of this invention in which the first material is formed as a continuous step-wave 60 while the second material comprises discrete squared Z-shape segments electrically connected, by way of plating or otherwise, to corresponding repetitive segments of continuous piece 60.

In accordance with the principles of this invention, the continuous material may be a conductor or semiconductor, and the discrete material may also be a conductor or semiconductor, and any combination of conductors or semiconductors joined together by way of plating, gluing, or other techniques may be employed. It is important that the second material be electrically joined to the first material between the regions of hot and cold, and the joining techniques could be such that there is discontinuous electrical contact or continuous electrical contact between these regions.

PRIOR ART STATEMENT

A novelty search has been conducted with regard to the instant invention, and U.S. Pat. No. 3,070,643, issued to Toulmin was the only patent discovered to be relevant to the instant invention.

The present invention relates to an entirely new construction for thermopiles. The new construction comprises a first material which is continuous and has repetitive segments with one portion extending between the regions of heat and cold and the other portion of the repeat segment extending from the cold to the hot region. A second material is joined to alternate repeat segments of the first material and the resulting thermopile assembly generates an electrical current under influence of a temperature gradient.

In some aspects and as discussed below, the invention is similar to a thermocouple, but all thermocouples are formed with separate elements joined together, with neither of the elements comprising a continuous strip extending from repetitive thermocouple segment to thermocouple segment.

Insofar as the second material is electrically connected to only one portion of the first material extending between the source and sink, it is possible that the Thomson effect is operative. The Thomson effect is generally described in the above-identified patent to Toulmin, Column 1, lines 44-50, and this patent fails to show or suggest a structure similar to the applicant's novel current generator.

I claim:

1. A current generator located in a temperature gradient between a heat source region and a heat sink region, said generator comprising a first continuous rigid material having thermoelectric characteristics and having a first portion extending between said source and sink and a second portion extending between said sink and source, and a second material having thermoelectric characteristics electrically connected with only one of said first or second portions of said first material, said first material serving as a rigid base for said current generator, said second material overlapping a portion of said first material, said current generator comprising a plurality of thermocouples formed of said first continuous material and said second material, connected at junctions with said junctions of said thermocouples formed where the second material overlaps the first material and is electrically joined thereto.

2. A current generator as claimed in claim 1, wherein said second material comprises a different composition from said first material.

3. A current generator as claimed in claim 1, wherein said second material is plated onto said first material.

4. A current generator as claimed in claim 1, wherein said second material is in continuous electrical contact with said first material where they overlap.

5. A current generator as claimed in claim 1, wherein said first continuous material comprises a single square wave-shape comprising a base portion located in the sink region and a top portion in the source region and two step portions connected between said top and base, said second material being in continuous contact with said first material along one of said two step portions.

6. A current generator as claimed in claim 5, wherein said second material is plated to said first material.

7. A current generator as claimed in claim 5, wherein said second material is folded about said first material such that a sandwich of said first and second material is formed at said one step portion.

8. A current generator as claimed in claim 1, wherein said first continuous material comprises a triangular shape formed of two legs with the top of said triangular shape formed by said two legs being in the source region and the base being in the sink region, said second material being in continuous contact with said first material along one of said legs.

9. A current generator as claimed in claim 8, wherein said second material is plated to said first material.

10. A current generator as claimed in claim 1, wherein said first and second materials are conductors.

11. A current generator as claimed in claim 1, wherein said first and second materials are semiconductors.

12. A current generator located in a temperature gradient between a heat source region and a heat sink region, said generator comprising an electrically first continuous material having repeat segments with each of said segments having one portion extending from said source to sink regions and at least a second portion extending from said sink to source regions, and a second electrically conductive material overlapping and electrically connected with at least a portion of said repeat portions of said repeat segments of said first material, said continuous material being rigid and forming a base for said current generator, said current generator comprising a plurality of thermocouples formed of said first continuous material and said second material joined at junctions, with said junctions formed at said overlapped portions.

13. A current generator as claimed in claim 12, wherein said second material comprises a different composition from said first material.

14. A current generator as claimed in claim 12, wherein said second material is plated onto said first material.

15. A current generator as claimed in claim 12, wherein said second material is in continuous electrical contact with said first material when they overlap.

16. A current generator as claimed in claim 12, wherein said first continuous material comprises a single square wave shape comprising a base located in the sink region and a top in the source region and two step portions connected between said top and base, said second material being in continuous contact with said first material along one of said two step portions.

17. A current generator as claimed in claim 16, wherein said second material is plated to said first material.

18. A current generator as claimed in claim 16, wherein said second material is folded about said first material such that a sandwich of said first and second material is formed at said one intermediate connecting portion.

19. A current generator as claimed in claim 12, wherein said first continuous material comprises a triangular shape formed of two legs with the top of said triangular shape formed by said two legs being in the source region and the base being in the sink region, said second material being in continuous contact with said first material along one of said legs.

20. A current generator as claimed in claim 19, wherein said second material is plated to said first material.

* * * * *